United States Patent
Chen et al.

(10) Patent No.: US 11,934,253 B2
(45) Date of Patent: Mar. 19, 2024

(54) COMPUTING-IN-MEMORY APPARATUS

(71) Applicant: National Yang Ming Chiao Tung University, Hsinchu (TW)

(72) Inventors: Wei-Zen Chen, Hsinchu (TW); Yu-Sian Liao, Hsinchu (TW)

(73) Assignee: National Yang Ming Chiao Tung University, Hsinchu (TW)

( * ) Notice: Subject to any disclaimer, the term of this patent is extended or adjusted under 35 U.S.C. 154(b) by 165 days.

(21) Appl. No.: 17/578,591

(22) Filed: Jan. 19, 2022

(65) Prior Publication Data
US 2023/0066113 A1 Mar. 2, 2023

(30) Foreign Application Priority Data
Aug. 26, 2021 (TW) .................. 110131671

(51) Int. Cl.
*G06F 1/3296* (2019.01)
*G05F 1/575* (2006.01)
*G06F 1/26* (2006.01)
*G06F 1/3203* (2019.01)
*G06F 1/3234* (2019.01)
*G11C 11/412* (2006.01)
*G11C 11/418* (2006.01)
*G11C 11/419* (2006.01)

(52) U.S. Cl.
CPC .......... *G06F 1/3296* (2013.01); *G11C 11/412* (2013.01); *G11C 11/418* (2013.01); *G11C 11/419* (2013.01); *G05F 1/575* (2013.01); *G06F 1/26* (2013.01); *G06F 1/3203* (2013.01); *G06F 1/3275* (2013.01)

(58) Field of Classification Search
CPC ........ G06F 1/3296; G06F 1/3203; G06F 1/26; G06F 1/3275; G11C 11/412; G11C 11/418; G11C 11/419; G05F 1/575
USPC .................................. 713/300, 320; 700/298
See application file for complete search history.

(56) References Cited

U.S. PATENT DOCUMENTS

| | | | |
|---|---|---|---|
| 10,410,690 B1 * | 9/2019 | Chang | G11C 11/56 |
| 11,460,879 B1 * | 10/2022 | Mehra | G06F 1/324 |
| 2019/0041930 A1 * | 2/2019 | Livingston | G06F 1/26 |
| 2021/0018541 A1 * | 1/2021 | Bayat | G11C 7/04 |
| 2021/0181831 A1 * | 6/2021 | Mosalikanti | H03K 5/24 |

* cited by examiner

*Primary Examiner* — Ji H Bae
(74) *Attorney, Agent, or Firm* — Amin, Turocy & Watson, LLP (57) ABSTRACT

A computing-in-memory apparatus is provided, which includes a voltage regulator having an amplifier and a reference current source, a computing-in-memory array having a plurality of computing units and a detection circuit connected to each other. The amplifier has a current input and a voltage output and is connected to the reference current source, and the voltage regulator provides an output voltage for supplying to the computing-in-memory array. An output current of the detection circuit is inputted into the voltage regulator to compare with the reference current source of the voltage regulator, and then a negative feedback convergence or a negative feedback mechanism is executed according to the comparison result to regulate the output voltage supplied by the voltage regulator to the computing-in-memory array.

11 Claims, 7 Drawing Sheets

FIG. 5

COMPUTING-IN-MEMORY APPARATUS

BACKGROUND

1. Technical Field

The present disclosure relates to a computing apparatus, and more particularly, to a computing-in-memory apparatus.

2. Description of Related Art

In the architecture of the computing-in-memory (CIM), the computing units (bit cells) of the memory are usually used to store the weight coefficient of the neural network, and the number of words is determined by the size of the filter and the number of channels. When the wordlines of the memory are activated, all relevant bit information is accumulated on the bitlines, thereby achieving the functions of parallelization and multiply accumulate (MAC).

The computing unit can be designed and divided into two operations, namely current mode and charge mode. In the multiply accumulate (MAC) of the conventional current mode, the output current of the bitlines cannot be effectively controlled, which often results in excessive output current, additional power consumption, and the effect of the voltage offset of the sense amplifier under excessive bias.

It is proposed to use a memory copy unit and a two-bit current mirror to generate an analog wordline (WL) drive voltage for adjusting the output current in the prior art. However, in the prior art, under the condition of small current output, due to the low drive voltage of the wordline (WL), the switching element in the computing unit enters the sub-threshold region. At this time, the output current of the element is easily affected by the matching issue, causing the linearity of the output current to deteriorate.

In the operation of charge mode, the memory unit can precharge the isolation capacitor, and then performs accumulation calculations through charge redistribution. Therefore, compared to the operation of the current mode, the biggest advantage of the charge mode is that it can normalize the output dynamic range without worrying about the problem of overloading bitlines. However, in order not to affect the use efficiency of the area, the unit capacitance value is often only 1 femtofarad (1 fF). Therefore, when the charges are redistributed, they are easily affected by the parasitic capacitance of the transistor and the switching element, resulting in a non-linear output response, and the injection charges of the switching of the transistor would also cause sampling errors.

Therefore, how to provide a new computing apparatus that can solve the aforementioned problems of the prior art or provide relevant functions is becoming an urgent issue in the art.

SUMMARY

The present disclosure provides a new computing-in-memory apparatus, which combines a computing-in-memory array (e.g., a SRAM array) with a voltage regulator (e.g., a distributed voltage regulator) and a detection circuit (e.g., a detection circuit in a distributed computing unit or a distributed computing unit detection circuit), adopts sub-threshold automatic bias design to reduce the power consumption of computing circuits of the computing-in-memory array, automatically adjusts an operation voltage of the computing units of the computing-in-memory array according to accurate reference current source provided by the voltage regulator, or regulates an output voltage of the voltage regulator via a negative feedback convergence or a negative feedback mechanism.

The present disclosure provides a computing-in-memory apparatus, which comprises: a voltage regulator having an amplifier and a reference current source, wherein the amplifier has a current input and a voltage output, and the amplifier and the reference current source are connected to each other; a computing-in-memory array having a plurality of computing units and connected to the voltage regulator having the amplifier and the reference current source, wherein the voltage regulator having the amplifier and the reference current source provides an output voltage to the computing-in-memory array having the plurality of computing units; and a detection circuit respectively connected to the voltage regulator and the computing-in-memory array having the plurality of computing units, wherein an output current of the detection circuit is inputted into the voltage regulator having the amplifier and the reference current source to compare the output current of the detection circuit with the reference current source of the voltage regulator, wherein a negative feedback convergence or a negative feedback mechanism is performed according to a comparison result of the output current of the detection circuit and the reference current source of the voltage regulator, and wherein the output voltage provided by the voltage regulator to the computing-in-memory array having the plurality of computing units is adjusted via the negative feedback convergence or the negative feedback mechanism.

Detailed descriptions are provided below with specific embodiments being set forth with respect to the appended drawings, such that the aforementioned features and advantages of the present disclosure can become apparent and more fully understood. Additional features and advantages of the present disclosure are discussed in part in the descriptions below, and said features and advantages can be understood in part from the descriptions or learnt from implementation of the present disclosure. It should be understood that both the general descriptions above and the detail descriptions below are provided for illustrative and explanatory purposes and should not be construed as to limit the scope of the present disclosure.

DETAILED DESCRIPTION OF THE EMBODIMENTS

Implementations of the present disclosure are described below by specific embodiments. Those skilled in the art can easily understand other advantages and technical effects of the present disclosure based on the content disclosed in this specification, and also implement or apply other equivalent implementations.

Figure 1:
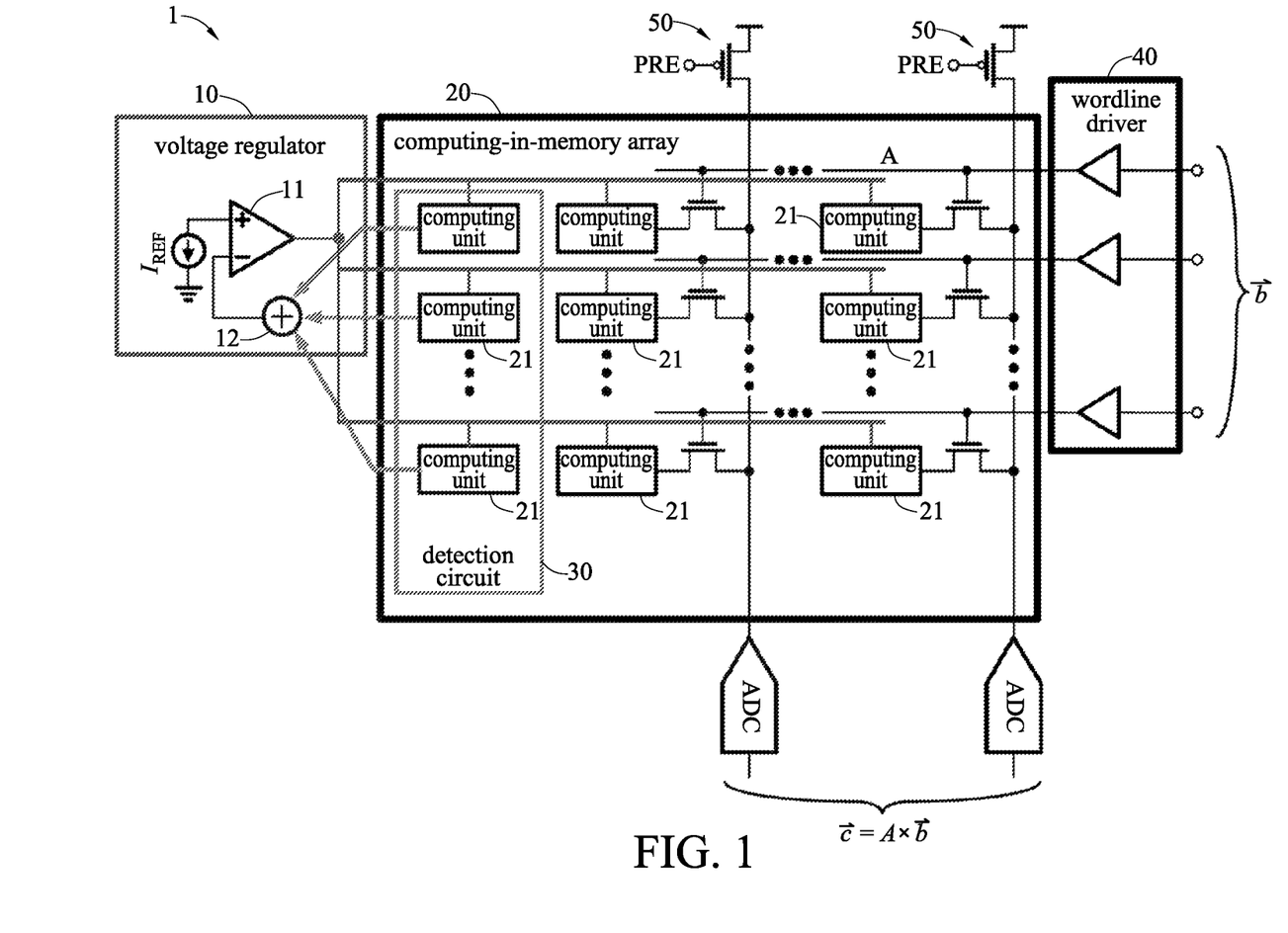
FIG. 1 is a schematic view of a basic circuit architecture of a computing-in-memory apparatus according to the present disclosure.

FIG. 1 is a schematic view of a basic circuit architecture of a computing-in-memory apparatus 1 according to the present disclosure. As shown, the computing-in-memory apparatus 1 includes a voltage regulator 10, a computing-in-memory array 20, at least one (e.g., a plurality of) detection circuit 30 (e.g., a detection circuit in a distributed computing unit), at least one (e.g., a plurality of) wordline driver 40, at least one (e.g., a plurality of) precharging element 50, and at least one (e.g., a plurality of) analog-to-digital converter ADC, etc. The computing-in-memory array 20 is respectively connected to the voltage regulator 10, the detection circuit 30 (e.g., a detection circuit in a distributed computing unit), the wordline driver 40, the precharging element 50, and the analog-to-digital converter ADC. The voltage regulator 10 has an amplifier 11, a reference current source $I_{REF}$, and a current adder 12. The computing-in-memory array 20 has a plurality of computing units 21. In the present disclosure, the term "connect" may mean "electrically connect" or "signally connect," and the term "plurality" may mean two or more (such as two, three, four, five or more).

For example, the voltage regulator 10 is a distributed voltage regulator, the computing-in-memory array 20 is a computing-in-memory circuit such as a static random access memory array (a SRAM array), the computing units 21 are computing-in-memory units such as bit units (e.g., bit cells), and the detection circuit 30 is an in-situ monitoring circuit such as a detection circuit in a distributed computing unit or a distributed computing unit detection circuit. However, the present disclosure is not limited as such.

The output voltage of the voltage regulator 10 (e.g., a distributed voltage regulator) is provided as the supply voltage for the computing-in-memory array 20 (e.g., a SRAM array) and the detection circuit 30 (e.g., a detection circuit in a distributed computing unit), and the amplifier 11 of the voltage regulator 10 has a current input and a voltage output. The current input of the amplifier 11 is a double-terminal input including a positive terminal (+) and a negative terminal (−). The positive terminal (+) of the amplifier 11 is connected with the reference current source $I_{REF}$, the negative terminal (−) of the amplifier 11 is connected with bitlines of the plurality of computing units 21 (e.g., bit units), and the bitlines of the plurality of computing units 21 connected to each other constitute the current adder 12.

The wordlines of the plurality of computing units 21 (e.g., bit units) of the computing-in-memory array 20 (e.g., a SRAM array) are connected to voltage outputs of the wordline driver 40, and the bitlines of the plurality of computing units 21 are connected (e.g., directly connected) to inputs of the analog-to-digital converters ADCs and outputs of the precharging elements 50. In the operation of the computing-in-memory apparatus 1, voltage inputs of the wordline driver 40 are regarded as a vector $\vec{b}$, the wordlines of the plurality of computing units 21 are driven by the voltage outputs of the wordline driver 40, the voltage values on the wordlines of the plurality of computing units 21 are regarded as an equivalent matrix A, and a calculation between the equivalent matrix A and the vector $\vec{b}$ (e.g., the equivalent matrix A multiplies the vector $\vec{b}$) is performed at the voltage outputs of the analog-to-digital converters ADCs to obtain a result vector $\vec{c}$ (i.e., the formula of the result vector $\vec{c}$ is $\vec{c}=A\times\vec{b}$).

The present disclosure combines the voltage regulator 10 (e.g., a distributed voltage regulator) with the large scale or plurality of computing units 21 (e.g., bit units) of the computing-in-memory array 20 (e.g., a SRAM array), so that when the computing-in-memory apparatus 1 executes computing in memory, the computing-in-memory apparatus 1 can synchronously and automatically adjust operation voltage of the computing-in-memory array 20 (e.g., a SRAM array) so as to overcome the influence of the manufacturing process or operating temperature variation of the large scale or plurality of computing units 21 (e.g., bit units) of the computing-in-memory array 20 (e.g., a SRAM array), reduce the power consumption of the computing circuits of the computing-in-memory array 20 (e.g., a SRAM array), achieve the weight normalization of the large scale or plurality of computing units 21 (e.g., bit units) of the computing-in-memory array 20 (e.g., a SRAM array) and meet the requirements of the operating dynamic range of the analog-to-digital converters ADCs.

The main circuit of the computing-in-memory apparatus 1 is roughly divided into three blocks, such as the voltage regulator 10 (e.g., a distributed voltage regulator) having the amplifier 11 and the reference current source $I_{REF}$, the computing-in-memory array 20 (e.g., a SRAM array) having the plurality of computing units 21, and the detection circuit 30 (e.g., a detection circuit in a distributed computing unit). The voltage regulator 10 has circuit structures of a current input and a voltage output and provides an output voltage for supplying to the computing circuits of the computing-in-memory array 20 (e.g., a SRAM array) having the plurality of computing units 21 (e.g., bit units). The output current of the detection circuit 30 (e.g., a detection circuit in a distributed computing unit) is inputted into the voltage regulator 10 (e.g., a distributed voltage regulator) having the amplifier 11 and the reference current source $I_{REF}$ so as to compare the output current of the detection circuit 30 with the reference current source $I_{REF}$ of the voltage regulator 10. Then, a negative feedback convergence or a negative feedback mechanism is executed according to the comparison result of the output current of the detection circuit 30 with the reference current source $I_{REF}$ of the voltage regulator 10, and the output voltage supplied by the voltage regulator 10 to the computing-in-memory array 20 (e.g., a SRAM array) having the plurality of computing units 21 (e.g., bit units) is regulated via the negative feedback convergence or the negative feedback mechanism.

Figure 2A:
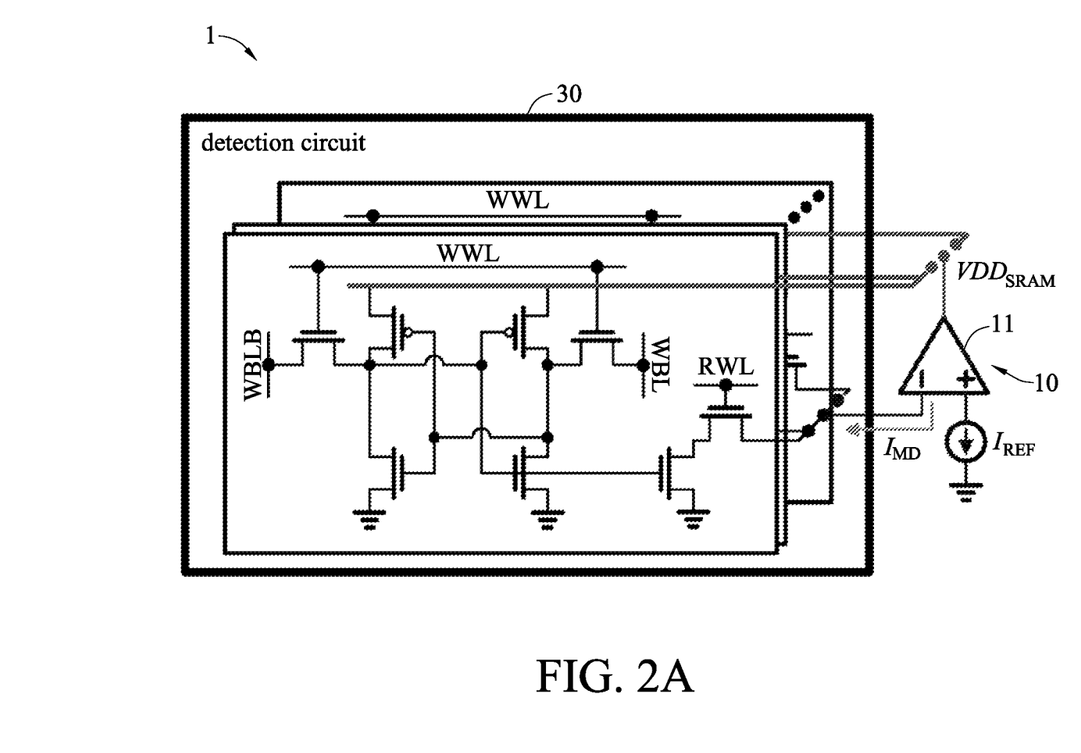
FIG. 2A is a detailed view illustrating the connection between a voltage regulator and a detection circuit in the computing-in-memory apparatus according to the present disclosure.
Figure 2B:
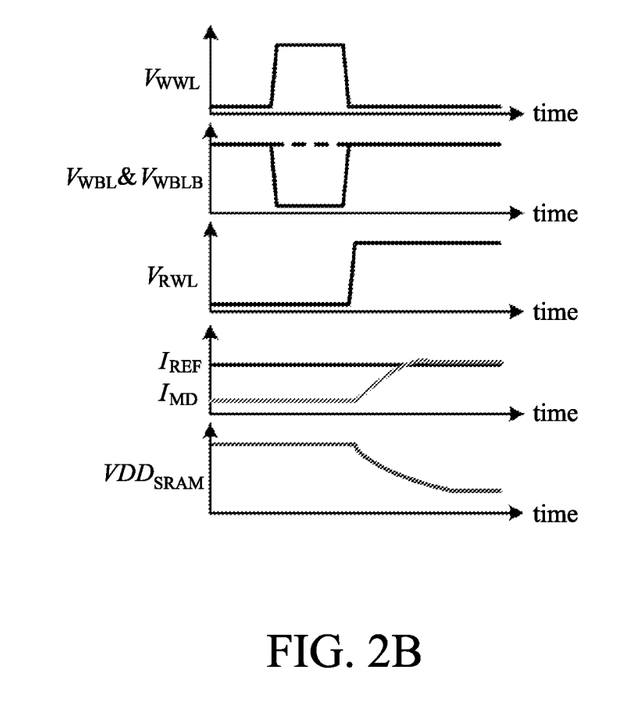
FIG. 2B is a schematic view illustrating an operation sequence of a voltage regulator and a detection circuit in the computing-in-memory apparatus according to the present disclosure.

FIG. 2A is a detailed view illustrating the connection between the voltage regulator 10 (e.g., a distributed voltage regulator) and the detection circuit 30 (e.g., a detection circuit in a distributed computing unit) in the computing-in-memory apparatus 1 according to the present disclosure. FIG. 2B is a schematic view illustrating an operation sequence of the voltage regulator 10 and the detection circuit 30 in the computing-in-memory apparatus 1 according to the present disclosure. FIGS. 2A and 2B are illustrated with reference to FIG. 1.

As shown in FIG. 2A, the detection circuit 30 (e.g., a detection circuit in a distributed computing unit) is composed of the same unit as the plurality of computing units 21 (e.g., bit units) of the computing-in-memory array 20 (e.g., a SRAM array). The supply voltage VDD of the detection circuit 30 (see FIG. 3) is connected to the voltage output of the amplifier 11 of the voltage regulator 10 (e.g., a distributed voltage regulator). The input of the amplifier 11 is connected to the reference current source $I_{REF}$, and the bitlines of the plurality of units in the detection circuit 30 are also connected to the input of the amplifier 11.

In terms of the operating principle of the detection circuit 30, the detection circuit 30 drives the write wordlines WWLs of the detection circuit 30 via a control logic circuit, and then writes the bits of initial setting of the write bitlines WBLs and the write bitline bars WBLBs of the detection circuit 30 into the computing-in-memory array 20 (e.g., a SRAM array), thus completing the initial condition setting of the operation of the detection circuit 30 (e.g., a detection circuit in a distributed computing unit).

As shown in FIG. 2B, in terms of the operation sequence of the detection circuit 30, the voltage $V_{WWL}$ on the write wordlines WWLs of the detection circuit 30 is pulled up to enable the computing-in-memory array 20 (e.g., a SRAM array) to write, and the corresponding bit is written into the detection circuit 30 (e.g., a detection circuit in a distributed computing unit) via the high and low difference of the voltage $V_{WBL}$ on the write bitlines WBLs and the voltage $V_{WBLB}$ on the write bitline bars WBLBs.

After the corresponding bit is written into the detection circuit 30 (e.g., a detection circuit in a distributed computing unit), the read wordlines RWLs of the detection circuit 30 are driven and read via the control logic circuit, so that the detection circuit 30 generates a current $I_{MD}$ to unload the output of the voltage regulator 10. The current $I_{MD}$ of the detection circuit 30 is compared with the accurate reference current source $I_{REF}$ of the voltage regulator 10, and the negative feedback convergence or the negative feedback mechanism is used to make the current $I_{MD}$ of the detection circuit 30 close to the value of the reference current source $I_{REF}$ of the voltage regulator 10, thereby stabilizing the supply voltage $VDD_{SRAM}$ provided by the voltage regulator 10 (e.g., a distributed voltage regulator) to the computing-in-memory array 20 (e.g., a SRAM array).

For example, under the normal operation voltage, if there is no regulation of the aforementioned negative feedback convergence or negative feedback mechanism, the higher supply voltage $VDD_{SRAM}$ would make the current $I_{MD}$ of the detection circuit 30 greater, the current $I_{MD}$ of the detection circuit 30 can be automatically adjusted via the aforementioned negative feedback convergence or negative feedback mechanism, so that the current $I_{MD}$ is close to the reference current source $I_{REF}$. In addition, when the reference current source $I_{REF}$ is set reasonably, the values of the supply voltage $VDD_{SRAM}$ and the current $I_{MD}$ can be reduced at the same time via the negative feedback convergence or the negative feedback mechanism, so that the power consumption of the computing-in-memory array 20 (e.g., a SRAM array) can be greatly reduced.

Figure 3:
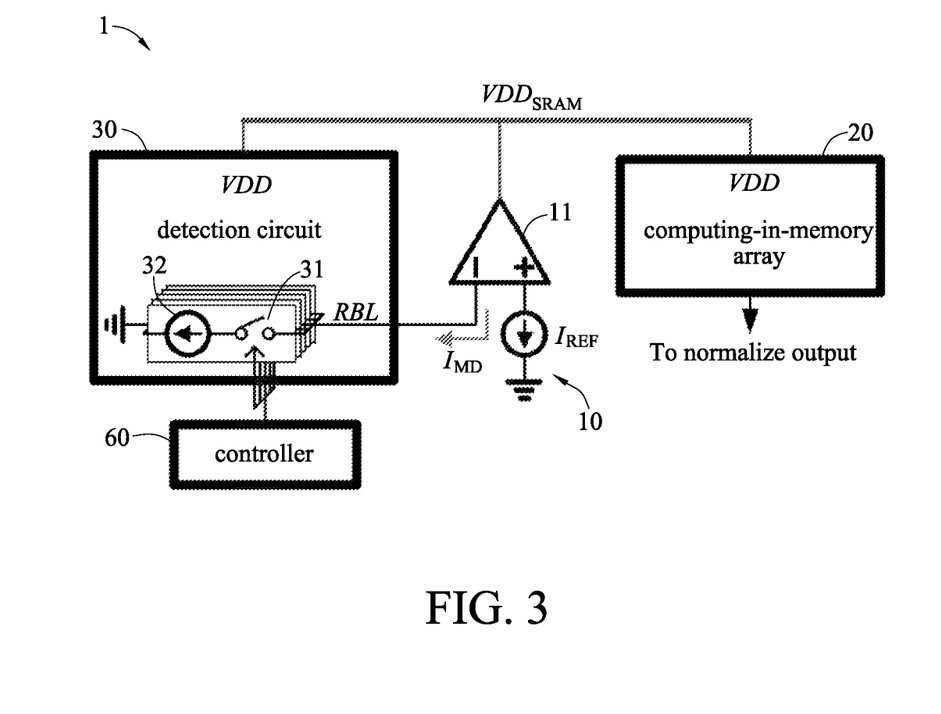
FIG. 3 is a schematic view illustrating the connection relationship between a voltage regulator, a computing-in-memory array and a detection circuit in the computing-in-memory apparatus according to the present disclosure.

FIG. 3 is a schematic view illustrating the connection relationship between the voltage regulator 10 (e.g., a distributed voltage regulator), the computing-in-memory array 20 (e.g., a SRAM array) and the detection circuit 30 (e.g., a detection circuit in a distributed computing unit) in the computing-in-memory apparatus 1 according to the present disclosure. The computing-in-memory apparatus 1 further includes at least one controller 60 (e.g., a control circuit).

As shown in FIG. 3, the plurality of units of the detection circuit 30 in FIG. 2A are equivalent to a circuit composed of a set of a switch circuit 31 and a current source 32 connected in series. The control voltage of the switch circuit 31 is the control voltage on the wordlines in the detection circuit 30, and the control voltage on the wordlines is provided by the controller 60 (e.g., a control circuit). The input current of the voltage regulator 10 (e.g., a distributed voltage regulator) is changed by turning on different numbers of switch circuits in the detection circuit 30. The supply voltage of the voltage regulator 10 (e.g., a distributed voltage regulator), the computing-in-memory array 20 (e.g., a SRAM array) and the detection circuit 30 (e.g., a detection circuit in a distributed computing unit) is adjusted by changes of the output voltage on the voltage regulator 10.

Based on the complete implement of the aforementioned concept, the computing-in-memory apparatus 1 includes one or a set of controllers 60 (such as a control circuit or a combination of at least two controllers) to input the control signal of the controller 60 (e.g., a control circuit) into the detection circuit 30 (e.g., a detection circuit in a distributed computing unit), and uses the aforementioned setting method of the initial operation condition of the detection circuit 30 (e.g., a detection circuit in a distributed computing unit) to normalize the output current of the large scale or plurality of computing units 21 (e.g., bit units) of the computing-in-memory array 20 (e.g., a SRAM array). In addition, by partitionally inputting the corresponding optimal codes, the operation voltage of the large scale or plurality of computing units 21 (e.g., bit units) of the computing-in-memory array 20 (e.g., a SRAM array) is partitionally adjusted to the optimal operation voltage value, thereby achieving the effect of power consumption optimization.

Figure 4A:
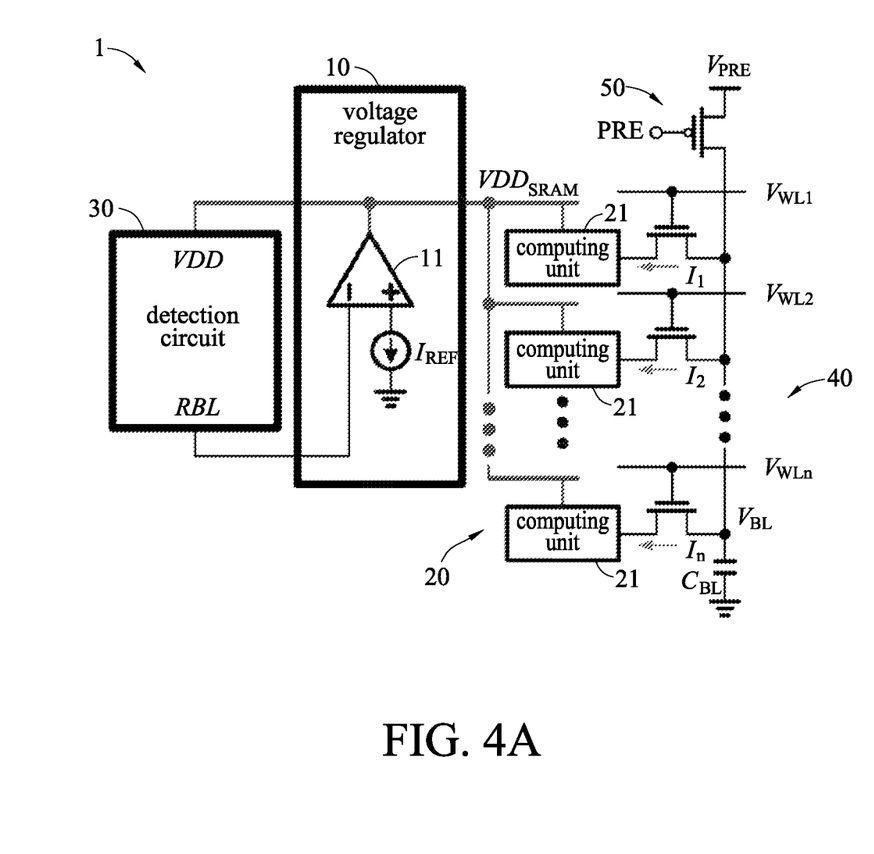
FIG. 4A is a schematic view of a computing-in-memory array having a plurality of computing units combined with a voltage regulator in the computing-in-memory apparatus according to the present disclosure.
Figure 4B:
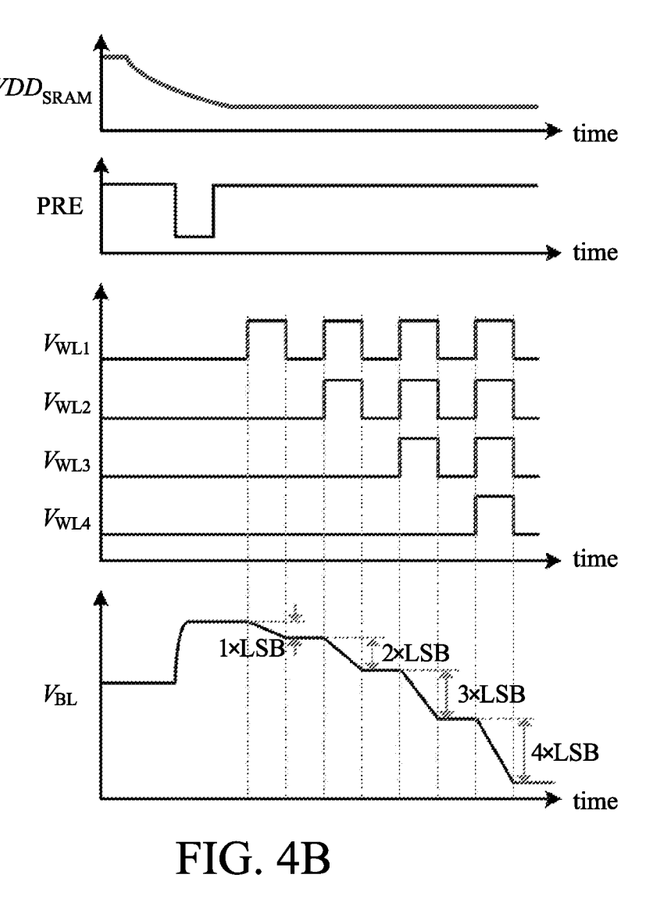
FIG. 4B is a schematic view illustrating an operation sequence of a computing-in-memory array having a plurality of computing units combined with a voltage regulator in the computing-in-memory apparatus according to the present disclosure.

FIG. 4A is a schematic view of the computing-in-memory array 20 (e.g., a SRAM array) having the plurality of computing units 21 (e.g., bit units) combined with the voltage regulator 10 in the computing-in-memory apparatus 1 according to the present disclosure. FIG. 4B is a schematic view illustrating an operation sequence of the computing-in-memory array 20 (e.g., a SRAM array) having the plurality of computing units 21 combined with the voltage regulator 10 in the computing-in-memory apparatus 1 according to the present disclosure.

As shown in FIG. 4A and FIG. 4B, the output voltage of the amplifier 11 of the voltage regulator 10 is used as the supply voltage of the detection circuit 30 (e.g., a detection circuit in a distributed computing unit) and the plurality of computing units 21 (e.g., bit units) of the computing-in-memory array 20 (e.g., a SRAM array). The wordlines of the plurality of computing units 21 (e.g., bit units) of the computing-in-memory array 20 (e.g., a SRAM array) are controlled by the voltage. For example, the voltage source of the wordlines of the plurality of computing units 21 (e.g., bit units) is controlled by drive voltage ($V_{WL1}$, $V_{WL2}$, ... , $V_{WLn}$) of the wordline driver 40, so that the computation result of the bitline voltage $V_{BL}$ is expressed in a voltage format on the bitlines of the plurality of computing units 21 (e.g., bit units) connected to each other. The aforementioned n represents a positive integer, and the wordline driver 40 provides a plurality of drive voltages ($V_{WL1}$, $V_{WL2}$, ... , $V_{WLn}$) and a bitline capacitive element $C_{BL}$.

The computing-in-memory apparatus 1 in FIG. 4A also includes one precharging element 50 shown in FIG. 1, and the output of the precharging element 50 is connected to bitlines of the plurality of computing units 21 (e.g., bit units). When the control voltage PRE of the precharging element 50 turns on the precharging element 50, the precharging element 50 charges the interconnected bitlines of the plurality of computing units 21 (e.g., bit units), and the charged charge can be regarded as stored on the bitline capacitive element $C_{BL}$.

The supply voltage $VDD_{SRAM}$ provided by the voltage regulator 10 (e.g., a distributed voltage regulator) can be used to switch the operation mode and dynamically adjust the operation voltage between the normal mode (e.g., a conventional SRAM operation mode) and the computing-in-memory (CIM) mode. In the normal mode (e.g., a conventional SRAM operation mode), the supply voltage $VDD_{SRAM}$ provides normal operation voltage to the computing-in-memory array 20 (e.g., a SRAM array). In the computing-in-memory mode (CIM mode), the optimal code of the detection circuit 30 (e.g., a detection circuit in a distributed computing unit) between partitions is given according to the aforementioned concept, and the output current of the detection circuit 30 (e.g., a detection circuit in a distributed computing unit) and the accurate reference current source $I_{REF}$ of the voltage regulator 10 (e.g., a distributed voltage regulator) are used to regulate the operation voltage of the computing-in-memory array 20 (e.g., a SRAM array) to optimize the power consumption between partitions, so that the element of the read bitline RBL of the detection circuit 30 enters the sub-threshold region. Since the drive voltage ($V_{WL1}$, $V_{WL2}$, ..., $V_{WLn}$) of the wordline driver 40 can be full swing, the matching issue of the output current ($I_1$, $I_2$, ..., $I_n$) flowing through and driving the computing-in-memory array 20 (e.g., a SRAM array) is not affected by the threshold voltage of the element of the read bitline RBL, such that the linearity of the output current ($I_1$, $I_2$, ..., $I_n$) is improved. When the turn-on time of the drive voltage ($V_{WL1}$, $V_{WL2}$, ..., $V_{WLn}$) of the wordline driver 40 is fixed, combining the voltage regulator 10 (e.g., a distributed voltage regulator) with the computing-in-memory array 20 (e.g., a SRAM array) to perform computing-in-memory operation can also effectively improve the linearity of the output current ($I_1$, $I_2$, ..., $I_n$).

As shown in FIG. 4B, after the detection circuit 30 (e.g., a detection circuit in a distributed computing unit) completes the initial state setting, the voltage regulator 10 (e.g., a distributed voltage regulator) adjusts the supply voltage $VDD_{SRAM}$ according to the reference current source $I_{REF}$ and the output current of the detection circuit 30 to adjust operation voltage of the large scale or plurality of computing units 21 (e.g., bit units) of the computing-in-memory array 20 (e.g., a SRAM array) to the operation state of the sub-threshold region so as to meet power budget requirements. Thereafter, the bitline voltage $V_{BL}$ on the bitlines of the plurality of computing units 21 (e.g., bit units) connected to each other is raised to the supply voltage $V_{PRE}$ set by the precharging element 50 via the precharging (PRE) signal of the precharging element 50, so as to raise the drive voltage ($V_{WL1}$, $V_{WL2}$, ..., $V_{WLn}$) of the corresponding wordline driver 40 according to the inputted weight matrix.

Since the present disclosure adopts the architecture of the computing-in-memory apparatus 1, the output current ($I_1$, $I_2$, ..., $I_n$) of the computing units 21 (e.g., bit units) of the computing-in-memory array 20 (e.g., a SRAM array) has been normalized. In addition, component mismatch caused by manufacturing process or temperature variation is compensated by voltage regulation. The analog output result of the multiply accumulate (MAC) is reflected on the value of the bitline voltage $V_{BL}$. The analog-to-digital converter ADC converts the analog output result of the multiply accumulate (MAC) to a digital code and arranges with control logic computation such as sparse coding so as to complete the computation of the large scale or plurality of computing units 21 (e.g., bit units) of the computing-in-memory array 20 (e.g., a SRAM array).

Figure 5:
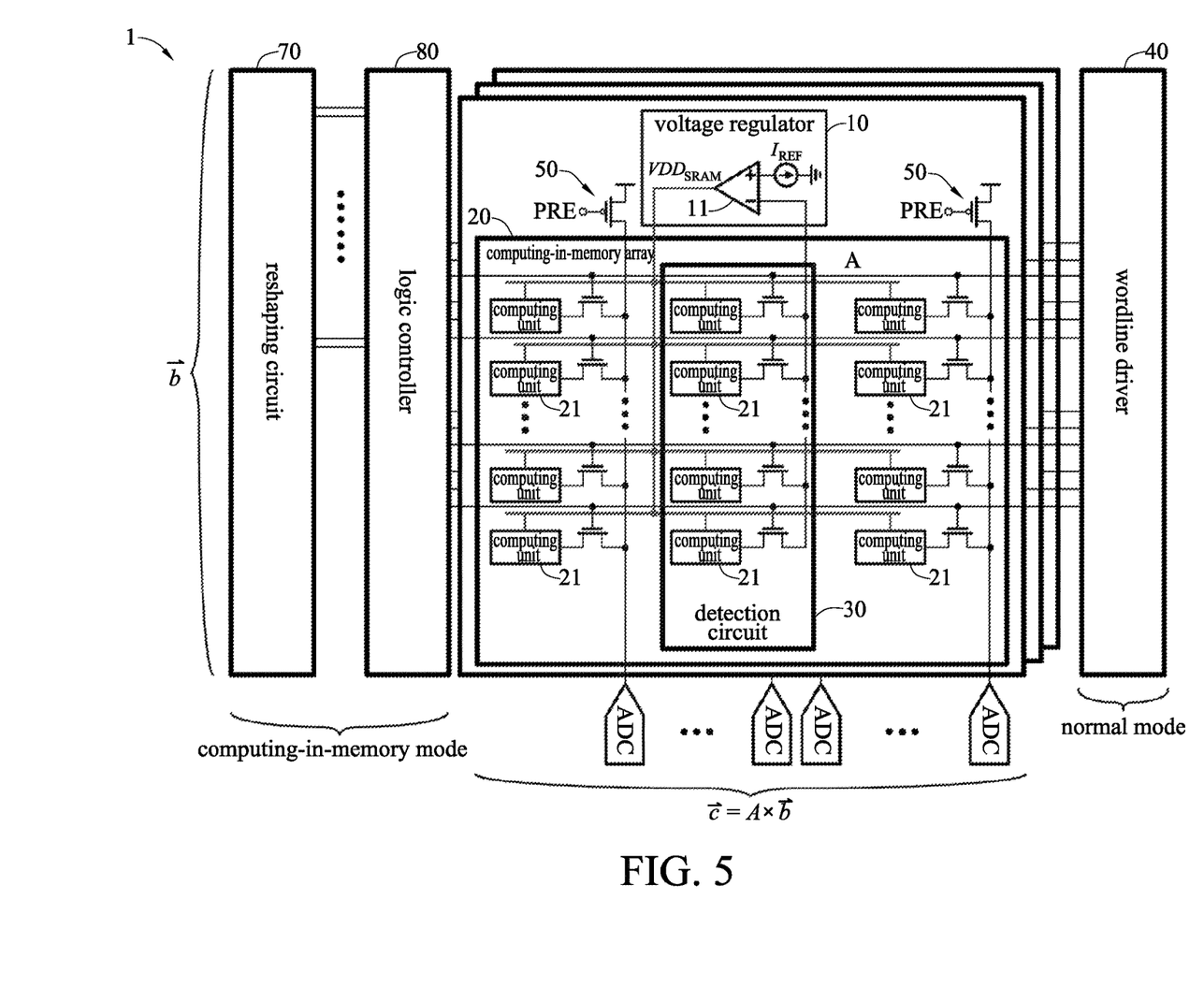
FIG. 5 is a schematic view illustrating a complete circuit connection state of a plurality of components including a computing-in-memory array in the computing-in-memory apparatus according to the present disclosure.

FIG. 5 is a schematic view illustrating a complete circuit connection state of a plurality of components including the computing-in-memory array 20 (e.g., a SRAM array) in the computing-in-memory apparatus 1 according to the present disclosure. FIG. 5 shows the complete architecture of the large scale or plurality of computing units 21 (e.g., bit units) of the computing-in-memory array 20 (e.g., a SRAM array). The computing-in-memory apparatus 1 further includes a reshaping circuit 70 and at least one logic controller 80 connected to each other. The reshaping circuit 70 can be a word-to-binary reshaping circuit, etc.

As shown, when the computing-in-memory array 20 (e.g., a SRAM array) is operated in the normal mode (e.g., a conventional SRAM operation mode), the output of the wordline driver 40 is connected with the wordlines of the plurality of computing units 21 (e.g., bit units) of the computing-in-memory array 20 (e.g., a SRAM array), and a portion of the bitlines of the computing units 21 (e.g., bit units) in the computing-in-memory array 20 (e.g., a SRAM array) are connected to each other. The output voltage of the wordline driver 40 is used to control the wordlines of the plurality of computing units 21 (e.g., bit units) of the computing-in-memory array 20 (e.g., a SRAM array). In the normal mode (e.g., a conventional SRAM operation mode), the computation result of the wordlines of the computing units 21 (e.g., bit units) controlled by the wordline driver 40 is obtained at the junction of the bitlines of a portion of the computing units 21 (e.g., bit units).

When the computing-in-memory array 20 (e.g., a SRAM array) is operated in the computing-in-memory mode (CIM mode), the junction of the wordlines of the plurality of computing units 21 (e.g., bit units) of the computing-in-memory array 20 (e.g., a SRAM array) is connected with the output lines of the logic controller 80, and the output voltage of the voltage regulator 10 (e.g., a distributed voltage regulator) provides the supply voltage of the computing-in-memory array 20 (e.g., a SRAM array) and the detection circuit 30 (e.g., a detection circuit in a distributed computing unit). Therefore, the output of the voltage regulator 10 (e.g., a distributed voltage regulator) is connected with the supply voltage points of the computing-in-memory array 20 (e.g., a SRAM array) and the detection circuit 30 (e.g., a detection circuit in a distributed computing unit), and the bitlines of the plurality of computing units 21 (e.g., bit units) of the computing-in-memory array 20 (e.g., a SRAM array) are connected with the output of the precharging element 50 and the input of the analog-to-digital converter ADC.

When the computing-in-memory mode (CIM mode) is performed, and the voltage input of the wordline driver 40 is regarded as a vector b to be transmitted in a voltage format, the voltage input (vector b) of the wordline driver 40 is first passed through the reshaping circuit 70 (e.g., a word-to-binary reshaping circuit) and the logic controller 80, and then the wordlines of the plurality of computing units 21 (e.g., bit units) of the computing-in-memory array 20 (e.g., a SRAM array) are controlled via the output voltage of the logic controller 80. When the wordline of the computing unit 21 (e.g., bit unit) of the computing-in-memory array 20 (e.g., a SRAM array) is driven, the equivalent matrix A formed by the wordlines of the plurality of computing units 21 (e.g., bit units) performs the computation with the aforementioned vector b. The computation result is reflected on a portion of the interconnected bitlines of the computing units 21 (e.g., bit units) in the computing-in-memory array 20 (e.g., a SRAM array), and the interconnected bitlines are also connected with the input of the analog-to-digital converter ADC. Therefore, the result vector c of the computation between the vector b and the equivalent matrix A formed by the wordlines of the plurality of computing units 21 (e.g., bit units) of the computing-in-memory array 20 (e.g., a SRAM array) is obtained from the output voltages of the plurality of analog-to-digital converters ADCs.

The output of the precharging element 50 is also connected with the bitlines of the computing units 21 (e.g., bit units) on a portion of the interconnected bitlines of the computing units 21 (e.g., bit units) of the computing-in-memory array 20 (e.g., a SRAM array). When the charging voltage PRE of the precharging element 50 turns on the precharging element 50, a portion of the interconnected bitlines of the computing units 21 (e.g., bit units) of the computing-in-memory array 20 (e.g., a SRAM array) are charged.

The present disclosure can be implemented under semiconductor manufacturing technology at different technology nodes and the structure of various memory units. The main technique is to combine the large scale or plurality of computing units 21 (e.g., bit units) of the computing-in-memory array 20 (e.g., a SRAM array) with the voltage regulator 10 (e.g., a distributed voltage regulator). In the case of supporting computing in memory, the operation voltage of the computing-in-memory array 20 (e.g., a SRAM array) is automatically adjusted to overcome the influence of the manufacturing process or operating temperature variation of the large scale or plurality of computing units 21 (e.g., bit units) of the computing-in-memory array 20 (e.g., a SRAM array), reduce the power consumption of the computing circuits of the computing-in-memory array 20 (e.g., a SRAM array), achieve the weight normalization of the large scale or plurality of computing units 21 (e.g., bit units) of the computing-in-memory array 20 (e.g., a SRAM array) and meet the requirements of the operating dynamic range of the analog-to-digital converters ADCs.

In summary, the computing-in-memory apparatus of the present disclosure has at least the following features, merits, or technical effects.

1. The present disclosure can combine a computing-in-memory array (e.g., a SRAM array) with a voltage regulator (e.g., a distributed voltage regulator) and a detection circuit (e.g., a detection circuit in a distributed computing unit) to adjust the power consumption of a large scale or plurality of computing units (e.g., bit units) of the computing-in-memory array (e.g., a SRAM array), and can also greatly reduce the power consumption of the multiply accumulate (MAC).

2. The present disclosure can utilize voltage regulation technique to overcome the influence of the manufacturing process or operating temperature variation of the large scale or plurality of computing units (e.g., bit units) of the computing-in-memory array (e.g., a SRAM array).

3. The present disclosure can adopt the sub-threshold automatic bias design, which can reduce the power consumption of computing circuits of the computing-in-memory array (e.g., a SRAM array). The present disclosure can also achieve the weight normalization of the large scale or plurality of computing units (e.g., bit units) via the automatic bias of the circuit, and can also meet the dynamic range requirements of the analog circuit.

4. The present disclosure can utilize the voltage regulator (e.g., a distributed voltage regulator) to automatically adjust the operation voltage of the large scale or plurality of computing units (e.g., bit units) of the computing-in-memory array (e.g., a SRAM array) so as to improve the weight normalization or computing linearity of the computing units.

5. The present disclosure can combine the voltage regulator (e.g., a distributed voltage regulator) and the detection circuit (e.g., a detection circuit in a distributed computing unit), and can automatically adjust the operation voltage of the large scale or plurality of computing units (e.g., bit units) of the computing-in-memory array (e.g., a SRAM array) according to the accurate reference current source provided by the voltage regulator, so that the computing units can achieve sub-threshold operation under the low power consumption of computing-in-memory mode (CIM mode), and the computing performance and linearity can also be improved.

6. The present disclosure can compare the current output of the detection circuit (e.g., a detection circuit in a distributed computing unit) with the reference current source of the voltage regulator (e.g., a distributed voltage regulator), regulate the output voltage of the voltage regulator with a negative feedback convergence or a negative feedback mechanism, provide the output voltage to the large scale or plurality of computing units (e.g., bit units) of the computing-in-memory array, reduce unnecessary power consumption on the bitlines via automatic bias mechanism, and concurrently achieve the normalization of the large scale or plurality of computing units (e.g., bit units) and improve linearity.

7. The present disclosure can be applied to the development of the large scale or plurality of computing units (e.g., bit units) of the computing-in-memory array, and any computing-in-memory circuit design constructed using random access memory units can be used as a reference technical guide.

8. The concept of the present disclosure is not limited to the structure of 6 T, 8 T, or 10 T (T stands for transistor). For example, any large scale or plurality of computing units (e.g., bit units) constructed via random access memory can use a detection circuit (e.g., a detection circuit in a distributed computing unit) combined with a voltage regulator (e.g., a distributed voltage regulator) to effectively achieve the effect of power regulation and also improve the weight normalization of the computing units.

The above embodiments are set forth to illustrate the principles, features and technical effects of the present disclosure, and should not be construed as to limit the present disclosure in any way. The above embodiments can be modified or changed by one of ordinary skill in the art without departing from the spirit and scope of the present disclosure. Any equivalent modifications and changes made in light of the disclosures herein should be encompassed by the appended claims. Therefore, the scope of the present disclosure should be delineated by the claims.

What is claimed is:

1. A computing-in-memory apparatus, comprising:
a voltage regulator having an amplifier and a reference current source, wherein the amplifier has a current input and a voltage output, and the amplifier and the reference current source are connected to each other;

a computing-in-memory array having a plurality of computing units and connected to the voltage regulator having the amplifier and the reference current source, wherein the voltage regulator having the amplifier and the reference current source provides an output voltage to the computing-in-memory array having the plurality of computing units; and a detection circuit respectively connected to the voltage regulator and the computing-in-memory array having the plurality of computing units, wherein an output current of the detection circuit is inputted into the voltage regulator having the amplifier and the reference current source to compare the output current of the detection circuit with the reference current source of the voltage regulator, wherein a negative feedback convergence or a negative feedback mechanism is performed according to a comparison result of the output current of the detection circuit and the reference current source of the voltage regulator, and wherein the output voltage provided by the voltage regulator to the computing-in-memory array having the plurality of computing units is adjusted via the negative feedback convergence or the negative feedback mechanism.

2. The computing-in-memory apparatus of claim 1, wherein the voltage regulator, the computing-in-memory array having the plurality of computing units and the detection circuit are a distributed voltage regulator, a static random access memory (SRAM) array having a plurality of bit units and a distributed computing unit detection circuit, respectively.

3. The computing-in-memory apparatus of claim 1, wherein the current input of the amplifier is a double-terminal input including a positive terminal and a negative terminal, wherein the positive terminal of the amplifier is connected with the reference current source, and the negative terminal of the amplifier is connected with bitlines of the plurality of computing units, and wherein the bitlines of the plurality of computing units constitute a current adder.

4. The computing-in-memory apparatus of claim 1, wherein the detection circuit drives write wordlines of the detection circuit via a control logic circuit, and writes bits of an initial setting of write bitlines and write bitline bars of the detection circuit into the computing-in-memory array having the plurality of computing units.

5. The computing-in-memory apparatus of claim 1, further comprising a wordline driver, at least one precharging element and at least one analog-to-digital converter respectively connected to the computing-in-memory array having the plurality of computing units, wherein wordlines of the plurality of computing units of the computing-in-memory array are connected to a voltage output of the wordline driver, and bitlines of the plurality of computing units are connected to an input of the analog-to-digital converter and an output of the precharging element.

6. The computing-in-memory apparatus of claim 1, further comprising at least one controller, wherein a plurality of units of the detection circuit are equivalent to a circuit composed of a set of a switch circuit and a current source connected in series, and wherein a control voltage of the switch circuit is a control voltage on wordlines of the detection circuit, and the control voltage on the wordlines is provided by the controller.

7. The computing-in-memory apparatus of claim 1, further comprising at least one wordline driver, wherein the output voltage of the amplifier of the voltage regulator serves as a supply voltage of the detection circuit and the plurality of computing units of the computing-in-memory array, and a voltage source of wordlines of the plurality of computing units is controlled by a drive voltage of the wordline driver.

8. The computing-in-memory apparatus of claim 1, further comprising at least one precharging element having an output connected to bitlines of the plurality of computing units, wherein when a control voltage of the precharging element turns on the precharging element, the precharging element charges the bitlines of the plurality of computing units, and the charged charge is regarded as stored on a bitline capacitive element.

9. The computing-in-memory apparatus of claim 1, further comprising at least one precharging element and at least one wordline driver, wherein a supply voltage of the voltage regulator adjusts an operation voltage of the plurality of computing units of the computing-in-memory array to an operation state of a sub-threshold region according to the reference current source and the output current of the detection circuit, and precharging signal of the precharging element raises a bitline voltage on a bitlines of the plurality of computing units to a supply voltage set by the precharging element to raise a drive voltage of the wordline driver.

10. The computing-in-memory apparatus of claim 1, wherein a supply voltage provided by the voltage regulator is used to switch an operation mode and dynamically adjust an operation voltage between a normal mode and a computing-in-memory mode, wherein in the normal mode, the supply voltage provides a normal operation voltage to the computing-in-memory array, and wherein in the computing-in-memory mode, the operation voltage of the computing-in-memory array is regulated via the output current of the detection circuit and the reference current source of the voltage regulator.

11. The computing-in-memory apparatus of claim 1, further comprising at least one wordline driver, a reshaping circuit and a logic controller, wherein a voltage input of the wordline driver passes through the reshaping circuit and the logic controller to control wordlines of the plurality of computing units of the computing-in-memory array via an output voltage of the logic controller.

* * * * *